United States Patent [19]
Momose et al.

[11] Patent Number: 5,227,654
[45] Date of Patent: Jul. 13, 1993

[54] SEMICONDUCTOR DEVICE WITH IMPROVED COLLECTOR STRUCTURE

[75] Inventors: Hiroshi Momose, Tokyo; Yukari Unno, Yokohama, both of Japan

[73] Assignee: Kabushiki Kaisha Toshiba, Kawasaki, Japan

[21] Appl. No.: 799,000

[22] Filed: Dec. 2, 1991

Related U.S. Application Data

[63] Continuation of Ser. No. 523,892, May 16, 1990, abandoned.

[30] Foreign Application Priority Data

May 17, 1989 [JP] Japan .................................. 1-121569

[51] Int. Cl.$^5$ .............................................. H01L 29/72
[52] U.S. Cl. ........................................ 257/370; 257/378
[58] Field of Search ................. 357/37, 34, 35, 45; 257/378, 370, 371

[56] References Cited

U.S. PATENT DOCUMENTS

| | | | |
|---|---|---|---|
| 3,920,493 | 11/1975 | Kravitz | 148/187 |
| 4,007,474 | 2/1977 | Yagi et al. | 357/34 |
| 4,267,557 | 2/1981 | Muramoto et al. | 357/20 |
| 4,388,634 | 6/1983 | Amantea et al. | 357/34 |
| 4,523,003 | 7/1985 | Beasom | 156/648 |

FOREIGN PATENT DOCUMENTS

| | | | |
|---|---|---|---|
| 0219641 | 4/1987 | European Pat. Off. | 357/23.5 |
| 1237712 | 6/1971 | United Kingdom | 357/34 |
| 1280022 | 7/1972 | United Kingdom | 357/34 |

OTHER PUBLICATIONS

Muller et al., Device Elec. for IC's, 1986, pp. 193–202.
Patent Abstracts of Japan, vol. 13, No. 46 (E-711)[3394] Feb. 2, 1989; Japanese Patent Document No. 63-240058, dated Oct. 5, 1988, NEC Corp.
IBM Technical Disclosure Bulletin, vol. 13, No. 7, Dec. 1970, p. 1981; "Symmetrical Transistor Structure", Davidson et al.

*Primary Examiner*—Andrew J. James
*Assistant Examiner*—Stephen D. Meier
*Attorney, Agent, or Firm*—Finnegan, Henderson, Farabow, Garrett & Dunner

[57] ABSTRACT

At least part of a low impurity concentration collector region which lies between the emitter and collector regions of a bipolar transistor in a Bi-CMOS device is formed to have a low impurity concentration. Therefore, a high emitter-collector withstanding voltage can be obtained. Further, at least part of the low impurity concentration collector region which lies between the base region and an opposite conductivity type region is formed to have a high impurity concentration. Therefore, the punch-through withstanding voltage of a parasitic transistor formed of the base, collector and, opposite conductivity type region can be enhanced, and, at the same time, the collector resistance can be reduced.

7 Claims, 6 Drawing Sheets

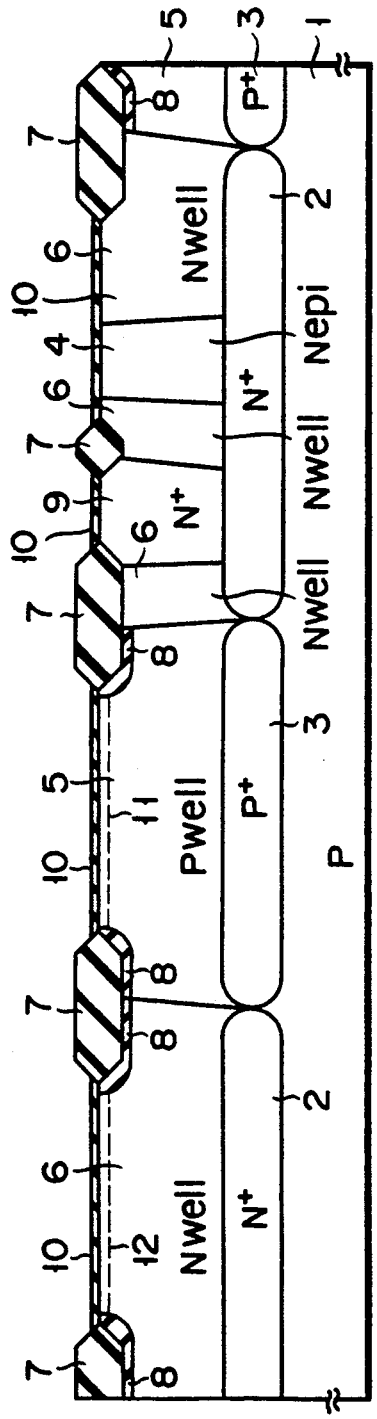
F I G. 3D
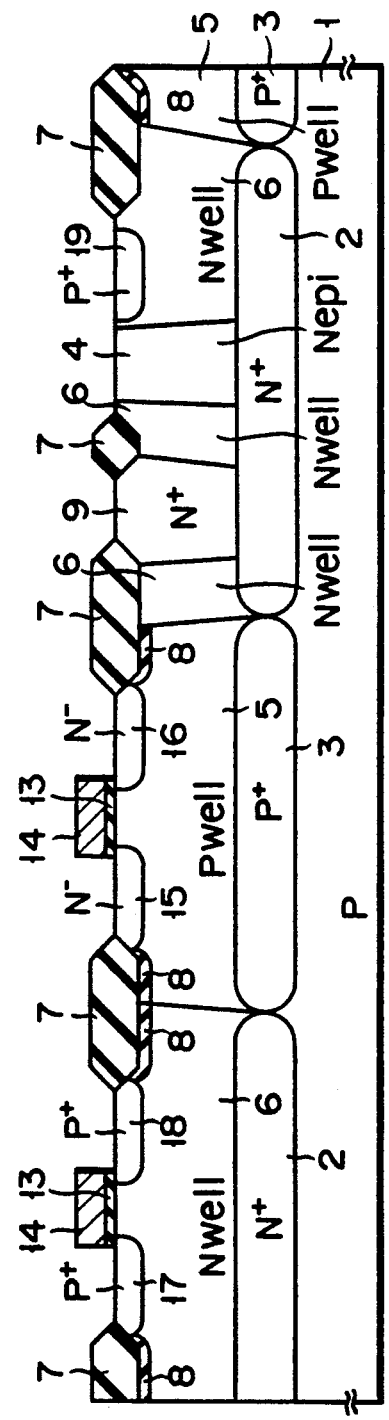
F I G. 3E

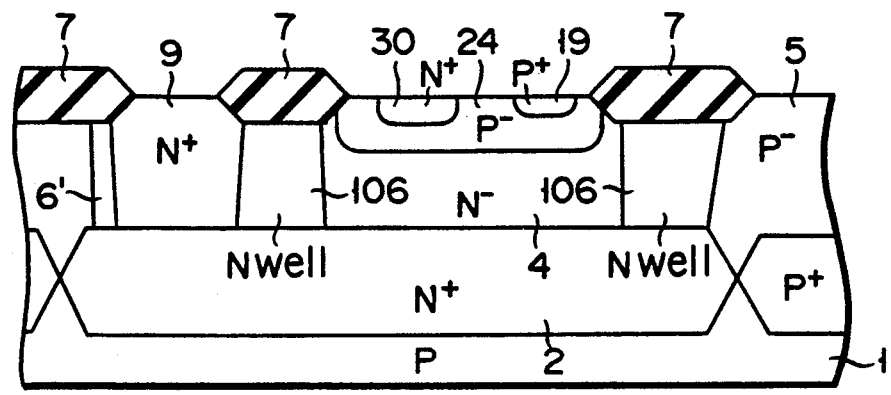
F I G. 4
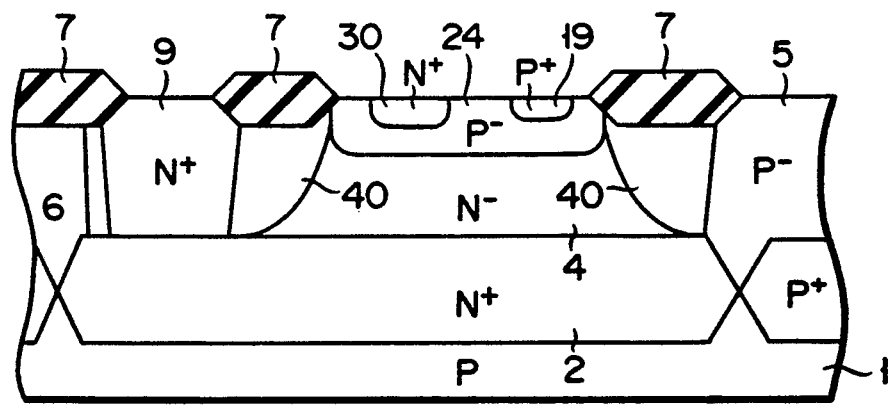
F I G. 5

SEMICONDUCTOR DEVICE WITH IMPROVED COLLECTOR STRUCTURE

This application is a continuation of application Ser. No. 07/523,892, filed May 16, 1990, now abandoned.

BACKGROUND OF THE INVENTION

1. Field of the Invention

This invention relates to a semiconductor device having bipolar transistors and a method for manufacturing the same, and more particularly to a Bi-CMOS device and a method of manufacturing the same.

2. Description of the Related Art

FIG. 1 is a cross sectional view showing the construction of a Bi-CMOS device having a bipolar transistor and CMOS transistors disposed therein disclosed in Japanese Patent Application No. 63-170683 filed by the Applicant of this invention. In FIG. 1, reference numeral 1 denotes a P-type substrate, 2 an N+-buried layer, 3 a P+-buried layer, 4 an N-type epitaxial layer, 5 a P-well region, 6 an N-well region, 7 a field oxide film, 9 an N+-diffused layer, 13 a polysilicon layer, 14 a gate oxide film, 15 an nMOS source region having a low impurity concentration, 16 an nMOS drain region having a low impurity concentration, 17 a pMOS source region, 18 a pMOS drain region, 19 an external base region, 20 a CVD-SiO$_2$ film, 21 an nMOS source region having a high impurity concentration, 22 an nMOS drain region having a high impurity concentration, 24 a base region, 28 a polysilicon layer serving as an emitter electrode, 30 an emitter region, 32 an interlayer film, and 36, 37 and 38 aluminum wirings. The pMOS transistor, nMOS transistor and bipolar transistor are formed on the same P-type substrate 1.

In the Bi-CMOS with the above construction, a drawback that the withstanding voltage between the emitter 30 and the collector 4 may be lowered occurs when the impurity concentration of the N-type epitaxial layer 4 acting as a collector of the bipolar transistor is high. In order to solve this drawback, it is considered to set the impurity concentration of the N-type epitaxial layer 4 lower than a predetermined impurity concentration.

FIG. 2 shows the relation between the impurity concentration of the collector and the collector-emitter withstanding voltage (open base). As shown in FIG. 2, as the impurity concentration Nc of the collector becomes lower, the collector-emitter voltage $BV_{CEO}$ becomes higher.

However, when the impurity concentration of the N-type epitaxial layer 4 of the bipolar transistor is lowered, current flows via a PNP parasitic transistor formed of the P-well region 5, N-type epitaxial layer 4 and base regions 24 and 19, causing a punch-through phenomenon. When the impurity concentration of the N-type epitaxial layer 4 is lowered, the resistance of the N-type epitaxial layer 4 becomes larger, making the collector resistance larger.

SUMMARY OF THE INVENTION

An object of this invention is to provide a semiconductor device in which the withstanding voltage preventing the punch-through phenomenon in a parasitic transistor can be set high and the collector resistance thereof can be set low while the emitter-collector withstanding voltage can be held at a desired value, and a method for manufacturing the same.

A semiconductor device of this invention comprises an emitter region of a first conductivity type formed on a semiconductor substrate; a base region of a second conductivity type formed to surround the emitter region., a low impurity concentration collector region of the first conductivity type formed to surround the base region; a high impurity concentration collector region of the first conductivity type formed under the low impurity concentration collector region; and a region of the second conductivity type which is opposite to the first conductivity type formed in contact with the low impurity concentration collector region; wherein at least part of the low impurity concentration collector region which lies between the emitter region and the high impurity concentration collector region is formed to have an impurity concentration lower than that of at least part of the low impurity concentration collector region which lies between the base region and the opposite conductivity type region.

A method of manufacturing a semiconductor device according to this invention, comprises the steps of: forming at least two first buried layers having a high impurity concentration on selected surfaces in a second MOS transistor-forming region and a bipolar transistor-forming region of the semiconductor substrate, respectively, and forming a second buried layer having a high impurity concentration in a first MOS transistor-forming region of the semiconductor substrate; forming an epitaxial layer of a first conductivity type on the entire surfaces of the semiconductor substrate; forming a well region of a second conductivity type in the first MOS transistor-forming region, said well region having an impurity concentration higher than that of the epitaxial layer; forming simultaneously at least two well regions of the first conductivity type in that portion of the epitaxial layer which is located above the second MOS transistor-forming region and that portion of the epitaxial layer which is located above the bipolar transistor-forming region and other than that portion located below an emitter-forming portion, respectively; forming a device-isolation insulating film on the surfaces of the resultant structure, selectively; forming a first MOS transistor in the well region of the second conductivity type formed in the first MOS transistor-forming region, and a second MOS transistor in the well region of the first conductivity type formed in the second MOS transistor-forming region; and forming a bipolar transistor in the epitaxial layer and the well region of the first conductivity type formed in the bipolar transistor-forming region.

In this invention, the impurity concentration of at least part of the low impurity concentration collector region which lies between the emitter region and the collector region is set low so that a high emittercollector withstanding voltage can be obtained. Further, the impurity concentration of at least part of the low impurity concentration collector region which lies between the base region and the opposite conductivity type region is set high so that a withstanding voltage preventing the punch-through phenomenon in the parasitic transistor formed of the base region, collector region and opposite conductivity type region can be enhanced and the collector resistance can be lowered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention

FIGS. 3A to 3G are cross sectional views for illustrating the process of manufacturing a first embodiment of a semiconductor device of this invention;

FIG. 4 is a cross sectional view showing the construction of a second embodiment of the semiconductor device of this invention; and FIG. 5 is a cross sectional view showing the construction of a third embodiment of the semiconductor device of this invention.

DETAILED DESCRIPTION OF THE PREFERRED EMBODIMENTS

There will now be described embodiments of the present invention with reference to the accompanying drawings.

Figure 1:
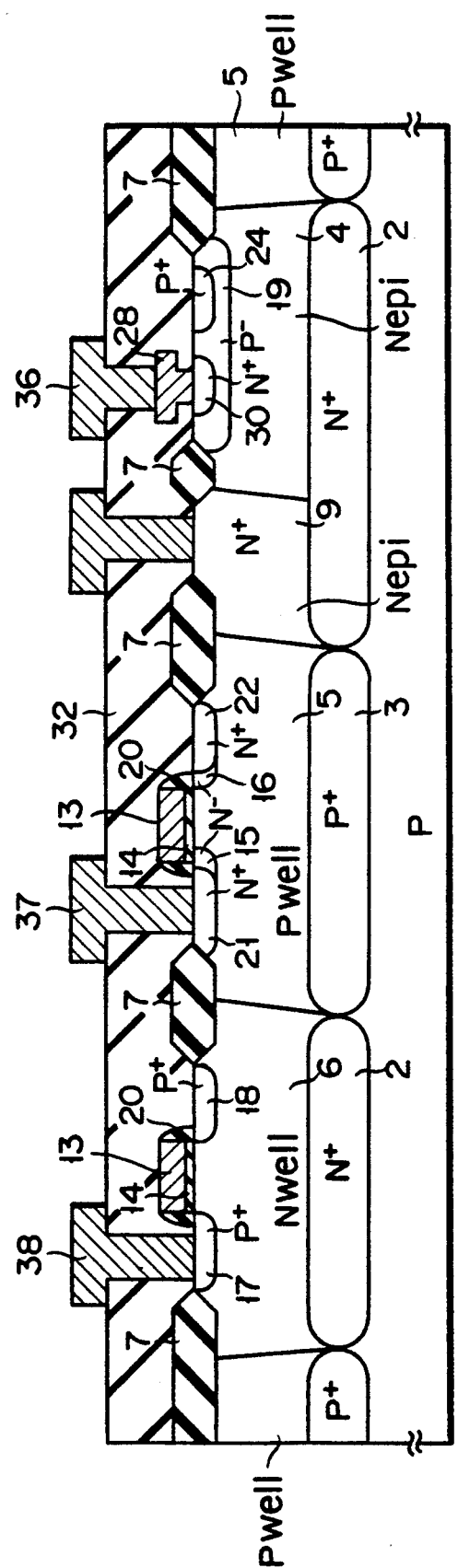
FIG. 1 is a cross sectional view showing the construction of the conventional Bi-CMOS device.
Figure 2:
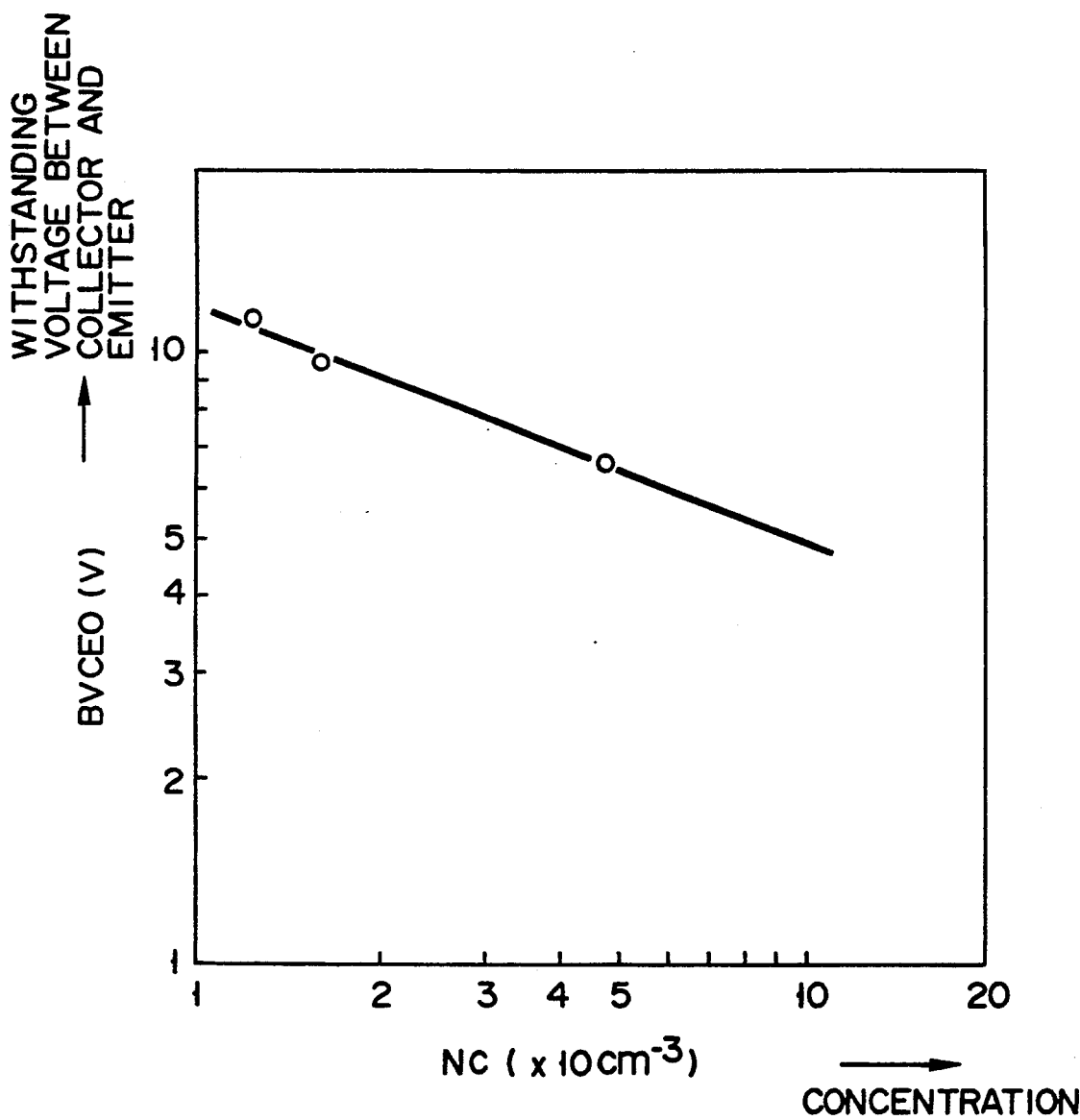
FIG. 2 shows the relation between the impurity concentration of the collector and the collector-emitter withstanding voltage in a bipolar transistor of FIG. 1.
Figure 3A:
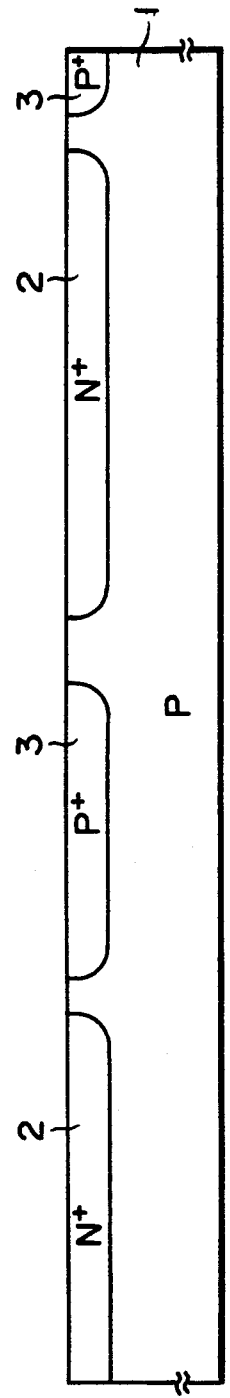

FIGS. 3A to 3G are cross sectional views for illustrating the steps of manufacturing a first embodiment of a semiconductor device of this invention. As shown in FIG. 3A, N+-buried layers 2 are selectively formed in those portions of the surface area of a P-type semiconductor substrate 1 of monocrystalline silicon on which a bipolar transistor and a pMOS transistor ar formed by using the lithographic method and ion-implantation technique. For example, arsenic (As) or antimony (Sb) is used in the ion-implantation process. The N+-buried layer 2 is used as a high impurity concentration collector region of the bipolar transistor. Then, boron (B) is ion-implanted into those portions of the surface area of the substrate 1 on which nMOS transistors are formed by using the lithographic method and ion-implantation technique to form P+-buried layers 3. The ion-implantation condition for boron (B) is that the acceleration energy is 100 KeV and the dose amount is $1.5 \times 10^{13}$ cm$^{-2}$, for example.

Figure 3B:
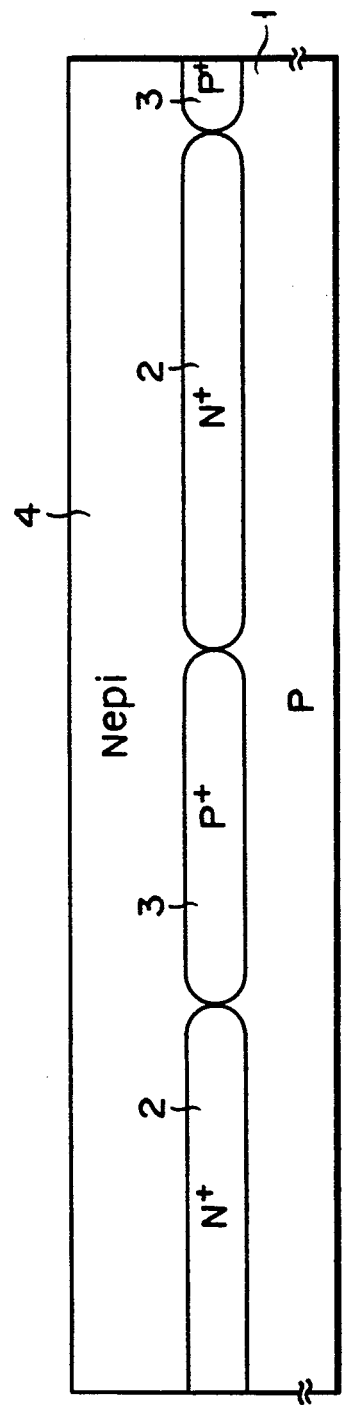

After this, as shown in FIG. 3B, an N-type epitaxial layer 4 containing phosphorus (P) of approx. $1 \times 10^{16}$ cm$^{-3}$, for example, is formed on the semiconductor substrate 1 by using the epitaxial growth method. At this time, the growth temperature is set at 1130° C. and the thickness of the epitaxial layer is approx. 1.2 μm.

Figure 3C:
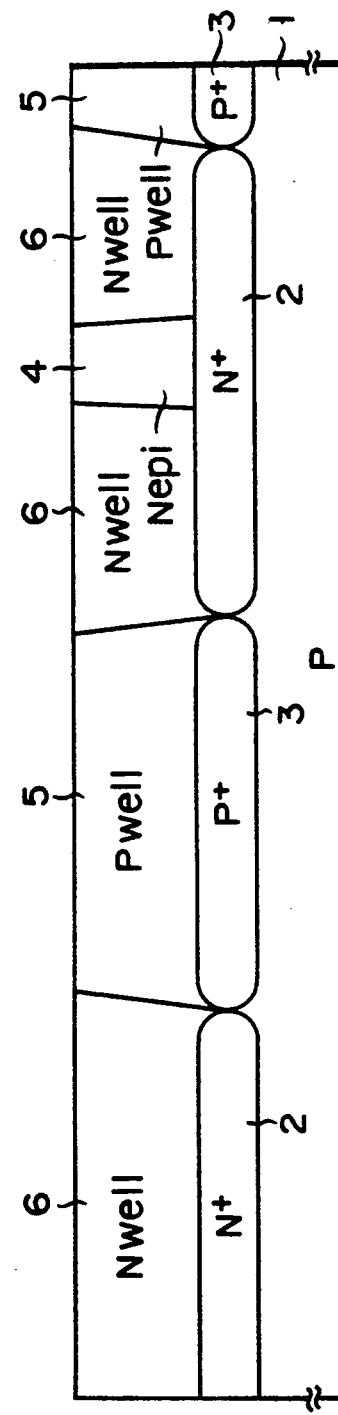

Next, as shown in FIG. 3C, a mask (not shown) is formed by using the lithographic method and then boron (B) is ion-implanted into the nMOS forming area of the N-type epitaxial layer 4 with the acceleration energy of 100 KeV and the dose amount of $6 \times 10^{12}$ cm$^{-2}$, for example, so as to selectively form P-well regions 5. After this, the mask is removed. Then, an ion-implantation mask (not shown) is formed on an area other than the pMOS forming area and emitter forming area by the lithographic method, and phosphorus (P) is then ion-implanted into the N-type epitaxial layer 4 with the acceleration energy of 160 KeV and the dose amount of $5 \times 10^{12}$ cm$^{-2}$, for example, so as to selectively form N-well regions 6 in the bipolar transistor forming areas.

Next, as shown in FIG. 3D, an SiN film (not shown) is formed and a preset ion-implantation mask (not shown) is formed on the SiN film as the preparation process for forming field oxide films 7. In order to form field inversion preventing ion-implanted regions 8 in the formation areas of the field oxide films 7 of the MOS transistors, arsenic (As) or antimony (Sb) is ion-implanted into the p-channel MOS transistor area, for example, and boron (B) is ion-implanted into the n-channel MOS transistor area, for example. Next, the field oxide films 7 for isolating the MOS transistors from each other and from the bipolar transistor are formed by the selective oxidation method. After this, a mask is formed on an area other than the formation area of an N+-type diffused region 9 in the N-well region 6 and the N+-type diffused region 9 is formed in connection with the N+-buried layer 2 by using the ion-implantation technique. Arsenic (As) or antimony (Sb) is used in the ion-implantation process for example.

Next, a dummy gate oxide film 10 is formed to a thickness of approx. 150 Å on the entire surface of the resultant structure by a thermal oxidation method. Then, channel ion-implantation regions 11 and 12 are formed in the P-well region 5 and N-well region 6, respectively. The channel ion-implantation regions 11 and 12 are formed to properly match the threshold voltages of the N-channel MOS transistor and P-channel MOS transistor and prevent occurrence of the punch-through phenomenon. The channel ion-implantation region 11 of the N-channel MOS transistor is formed by ion-implanting boron (B) ions with the acceleration energy of 20 KeV and the dose amount of $4 \times 10^{12}$ cm$^{-2}$, for example. The channel ion-implantation region 12 of the P-channel MOS transistor is formed by effecting two ion-implantation processes including the process of ion-implanting boron (B) ions with the acceleration energy of 20 KeV and the dose amount of $3 \times 10^{12}$ cm$^{-2}$ and the process of ion-implanting phosphorus (P) ions with the acceleration energy of 240 KeV and the dose amount of $2 \times 10^{12}$ cm$^{-2}$.

Next, as shown in FIG. 3E, the dummy gate oxide film 10 is completely removed from the entire surface and then a gate oxide film is formed to a thickness of approx. 150 Å on the entire surface by using the thermal oxidation method. In order to form gate electrodes 14, a polysilicon layer is deposited to a predetermined thickness on the gate oxide film by the chemical vapor deposition (CVD) method. Then, impurity is doped into the polysilicon layer by a phosphorus (P) diffusing method to lower the resistance of the polysilicon layer. The gate oxide film and the polysilicon layer are patterned by using the lithographic process so as to form gate insulation films 13 and the gate electrodes 14 of the MOS transistors on the P-well region 5 and N-well region 6. After a mask is formed on an area other than the P-well region 5, and then phosphorus (P) ions are ion-implanted into the P-well region 5 to form an N$^-$-type source region 15 and drain region 16. At this time, the field oxide film 7 and gate electrodes 14 are served as masks. The ion-implantation process is effected with the acceleration energy of, for example, 60 KeV and the dose amount of $4 \times 10^{13}$ cm$^{-2}$, for example. Likewise, a mask is formed on an area other than the N-well region 6 and then BF$_2$ ions are ion-implanted into the N-well region 6 to form a P+-type source region 17 and drain region 18. The ion-implantation process is effected with the acceleration energy of, for example, 50 KeV and the dose amount of $5 \times 10^{15}$ cm$^{-2}$, for example. By the ion-implantation of BF$_2$ ions, an external base region 19 in the formation area of the bipolar transistor is also formed.

Figure 3F:
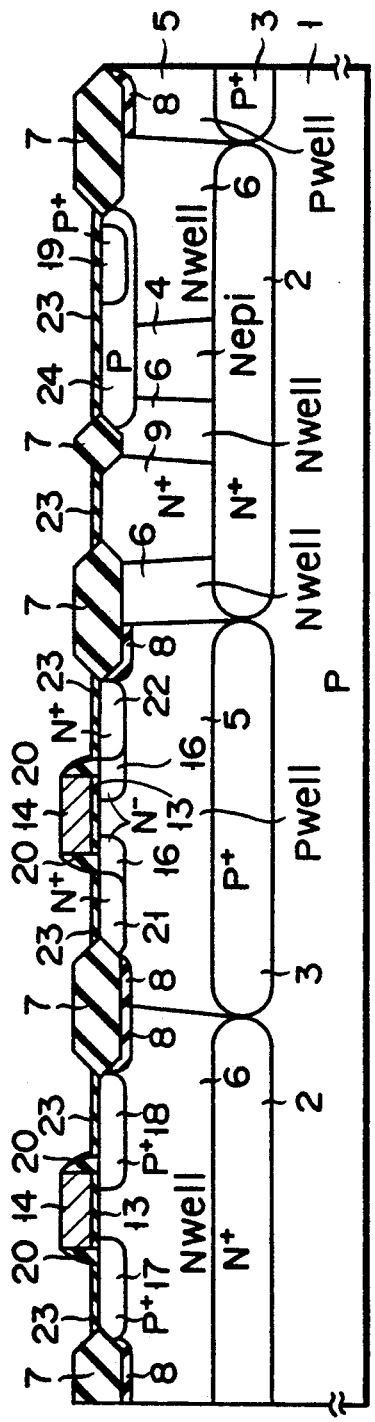

Next, as shown in FIG. 3F, a CVD-SiO$_2$ film (not shown) is deposited to a thickness of 2000 Å on the entire surface by the CVD method and then the CVD-SiO$_2$ film is etched by an anisotropic etching method such as a reactive ion etching (RIE) method to leave SiO$_2$ films 20 only on the side portions of the gate electrodes 14. After this, a mask is formed on an area other than the P-well region 5 and then As ions are ion-implanted into the surface area with the acceleration energy of 50 KeV and the dose amount of $5 \times 10^{15}$ cm$^{-2}$ so as to form an N$^+$-type source region 21 and N$^+$-type drain region 22 in the P well region 5. As a result, an N-channel MOS transistor of so-called lightly doped drain (LDD) structure is formed. Then, an oxidation process is effected at a temperature of 900° C. in an O$_2$ atmosphere for 30 minutes to form an oxide film 23 on the entire surface. A mask is formed by the lithographic method and then a P-type base region 24 of the bipolar transistor is formed. The base region 24 is formed by ion-implanting BF$_2$ ions with the acceleration energy of, for example, 30 KeV and the dose amount of $5 \times 10^{13}$ cm$^{-2}$, for example. After this, the mask is removed.

Figure 3G:
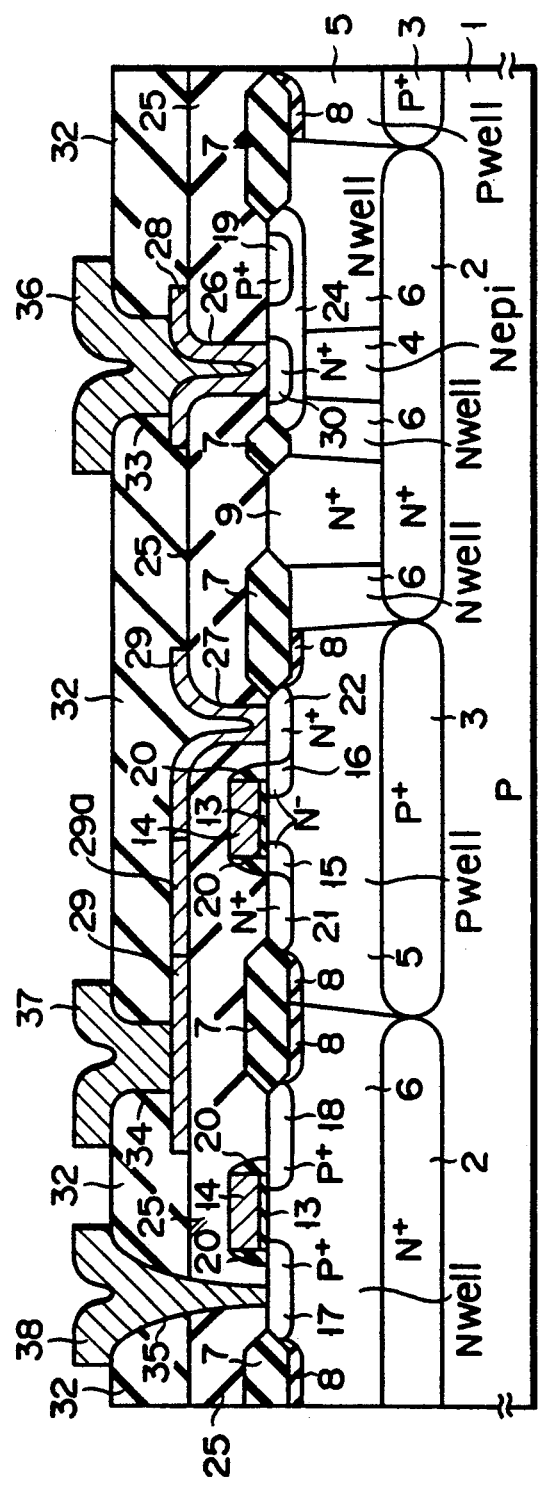

Next, as shown in FIG. 3G, a CVD-SiO$_2$ film 25 is deposited to a thickness of 2000 Å on the entire surface by the CVD method. Then, a contact hole 26 which reaches the surface of the base region 24 is formed in the CVD-SiO$_2$ film 25 by the RIE method, and a contact hole 27 which reaches the surface of the N$^+$-type drain region 22 of the N-channel MOS transistor is also formed in the CVD-SiO$_2$ film 25. After this, a polysilicon layer is deposited to a thickness of 2000 Å on the entire surface. Then, it is patterned by using the lithographic method and RIE method so as to leave polysilicon layers 28, 29 and 31. Next, a mask (not shown) such as a photoresist is formed to cover part of the polysilicon layer 29, and As ions are ion-implanted into the polysilicon layers 28 and 29 with the acceleration energy of 50 KeV and the dose amount of $5 \times 10^{15}$ cm$^{-2}$. Then, the mask is removed. By the ion-implantation process, an N-type emitter region 30 is formed in part of the base region 24, and at the same time, the electrical resistance of the polysilicon layer 28 is lowered to form the emitter electrode of the bipolar transistor. Further, the resistance of a portion of the polysilicon layer 29 other than a polysilicon layer 29a is lowered by the above ion-implantation process to form a drain wiring of the N-channel MOS transistor. That portion of the polysilicon layer whose resistance is not lowered is used as the high-resistance element 29a. The two N-well regions 6 formed in contact with the P-type base region 24 and the N-type epitaxial layer 4 constitute a low impurity concentration collector region.

Next, an interlayer film 32 formed of a CVD-SiO$_2$ film and a BPSG (silicon glass containing B and P) film which is an insulation film is deposited on the entire surface to make the surface flat. A contact hole 33 which reaches the polysilicon layer 28 serving as the emitter electrode and a contact hole 34 which reaches the polysilicon layer 29 serving as the drain wiring is formed in the interlayer film 32 by using the RIE method. Further, a contact hole 35 which reaches the source region 17 of the P-channel MOS transistor is formed in the interlayer film 32 and CVD-SiO$_2$ film 25. Then, aluminum for wirings is deposited on the entire surface by a vapor deposition method or the like and it is patterned by the photolithographic method and RIE method to form aluminum wirings 36, 37 and 38. In this way, the semiconductor device of the first embodiment of this invention is completed.

According to the first embodiment, since the N-well region 6 having a relatively high impurity concentration is formed in the low impurity concentration collector region between the base region 24 and the P-well region 5, occurrence of the punch-through phenomenon in the bipolar transistor formed of the base region 24, N-well region 6 serving as the relatively high impurity concentration collector region and the P-well region 5 can be prevented. Further, since the impurity concentration of the N-type epitaxial layer (collector region) 4 formed below the emitter region 30 is lower than that of the N-well region 6, the emitter-collector withstanding voltage can be kept at a proper value. In addition, since the N-well region 6 having an impurity concentration higher than that of the N-type epitaxial layer 4 is formed between the base region 24 and the N$^+$-type diffused layer 9, the collector resistance can be reduced.

Further, in the above method of manufacturing the semiconductor device, the step of forming the N-well region 6 of the pMOS transistor and the step of forming the N-well region 6 in the N-type epitaxial layer 4 of the bipolar transistor can be effected at the same time. Therefore, the number of steps is not increased in comparison with the conventional manufacturing method.

Further, in the first embodiment, the P-type base region 24 is formed in contact with the collector of the npn junction transistor, but the same effect can be attained in a case where an N-type base region is formed in contact with the collector of a pnp junction transistor.

FIG. 4 is a cross sectional view showing a second embodiment of the semiconductor device of this invention. In FIG. 4, portions which are the same as those in the first embodiment are denoted by the same reference numerals and the explanation thereof is omitted. As shown in FIG. 4, in the second embodiment, an N-well region 106 of high impurity concentration which is a collector of the bipolar transistor is formed so as not to be in contact with a base region 24. That is, all the portion lying under the P-type base region 24 of the bipolar transistor is formed of an N-type epitaxial layer 4 of low impurity concentration, and the N-well region is formed separately from the base region 24.

With the second embodiment, the junction capacitance of the N-type epitaxial layer 4 serving as the collector can be reduced in comparison with the case of the first embodiment, and, at the same time, occurrence of the punch-through phenomenon of a parasitic transistor can be prevented and the collector resistance can be reduced as in the first embodiment.

FIG. 5 is a cross sectional view showing the construction of a third embodiment of the semiconductor device of this invention. In the third embodiment, a field N$^-$-region 40 is formed in the surface area of an N-type epitaxial layer 4 of the bipolar transistor. The method of forming the semiconductor device of the third embodiment is explained with reference to FIGS. 3 and 5. In the third embodiment, after the steps of FIGS. 3A and 3B are effected, a step of FIG. 3C in which an N-well region 6 is formed in a bipolar transistor forming area is not effected. When a step of FIG. 3D in which a field inversion preventing ion-implanted region 8 is formed in a P-channel MOS transistor area by the ion-implantation technique is effected, ions are simultaneously implanted in those portions of the N-type epitaxial layer 4 other than the base forming area 24 of the bipolar transistor forming area, N+-diffused layer 9 and P-well region 5, thus forming the field N−-region 40. After this, the mask is removed and then the same steps as those of the first embodiment are effected.

With the third embodiment, the junction capacitance of the collector can also be reduced. Further, the withstanding voltage against the punch-through of the parasitic transistor can be raised and the collector resistance can be reduced.

As described above, according to this invention, a semiconductor device can be obtained in which occurrence of the punch-through phenomenon of the parasitic transistor can be prevented without lowering the collectoremitter withstanding voltage (open base).

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an emitter region of a first conductivity type formed on said semiconductor substrate;
   a base region of a second conductivity type formed to surround said emitter region;
   a collector region of the first conductivity type including a low impurity concentration collector portion and a high impurity concentration collector portion;
   a high impurity concentration collector electrode connecting region of the first conductivity type formed on and in contact with a part of said high impurity concentration collector portion;
   wherein said high impurity concentration collector portion includes a buried layer under said base region, said low impurity concentration collector portion includes a first low impurity concentration portion which is underneath said emitter region to connect said base region to said high impurity concentration collector portion and a second low impurity concentration portion surrounding said base region and said first low impurity concentration portion to isolate said base region and said first low impurity concentration portion from regions surrounding said collector region, with the impurity concentration of said first low impurity concentration portion being lower than that of said second low impurity concentration portion.

2. A semiconductor device according to claim 1, further comprising a first conductivity type region formed in a MOS transistor forming area on said semiconductor substrate;
   source and drain regions of the second conductivity type separately formed on said first conductivity type region; and
   an electrode formed on said first conductivity type region which lies between said source and drain regions;
   wherein said emitter region formed said low impurity concentration collector region and in said first conductivity type region have the same impurity concentration.

3. A semiconductor device comprising:
   a semiconductor substrate;
   an emitter region of a first conductivity type formed on said semiconductor substrate;
   a base region of a second conductivity type formed to surround said emitter region;
   a collector region of the first conductivity type including a low impurity concentration collector portion and a high impurity concentration collector portion;
   a high impurity concentration collector electrode connecting region of the first conductivity type formed on and in contact with a part of said high impurity concentration collector portion;
   a first well region of the second conductivity type formed in contact with said low impurity concentration collector portion;
   a second well region of the second conductivity type formed on said semiconductor substrate;
   a third well region of the first conductivity type formed on said semiconductor substrate;
   a first MOS transistor of the first conductivity type formed in said second well region; and
   a second MOS transistor of the second conductivity type formed in said third well region;
   wherein said high impurity concentration collector portion includes a buried layer under said base region, said low impurity concentration collector portion includes a first low impurity concentration portion which is underneath said emitter region to connect said base region to said high impurity concentration collector portion and a second low impurity concentration portion surrounding said base region and said first low impurity concentration portion to isolate said base region and said first low impurity concentration portion from regions surrounding said collector region, with the impurity concentration of said first low impurity concentration portion being lower than that of said second low impurity concentration portion.

4. A semiconductor device comprising:
   a semiconductor substrate;
   an emitter region of a first conductivity type formed on said semiconductor substrate;
   a base region of a second conductivity type formed to surround said emitter region;
   a collector region of the first conductivity type including a low impurity concentration collector portion and a high impurity concentration collector portion;
   a high impurity concentration collector electrode connecting region of the first conductivity type formed on and in contact with a part of said high impurity concentration collector portion;
   wherein said high impurity concentration collector portion includes a buried layer under said base region, said low impurity concentration collector portion includes a first low impurity concentration portion which is directly below said base region and between said base region and said high impurity concentration collector portion to connect said base region to said high impurity concentration collector portion, and a second low impurity concentration portion out of contact with said base region and surrounding said base region and said first low impurity concentration portion to isolate said base region and said first low impurity concentration portion from regions surrounding said collector region, with the impurity concentration of said first low impurity concentration portion being lower than that of said second low impurity concentration portion.

5. A semiconductor device according to claim 4, further comprising a first conductivity type region formed in a MOS transistor forming area on said semiconductor substrate;
    source and drain regions of the second conductivity type separately formed on said first conductivity type region; and
    an electrode formed on said first conductivity type region which lies between said source and drain regions;
    wherein said emitter region is formed in said low impurity concentration collector portion and has the same impurity concentration as said first low impurity concentration portion.

6. A semiconductor device comprising:
a semiconductor substrate;
an emitter region of a first conductivity type formed on said semiconductor substrate;
a base region of a second conductivity type formed to surround said emitter region;
a collector region of the first conductivity type including a low impurity concentration collector portion and a high impurity concentration collector portion;
a high impurity concentration collector electrode connecting region of the first conductivity type formed on and in contact with a part of said high impurity concentration collector portion;
wherein said high impurity concentration collector portion includes a buried layer under said base region, said low impurity concentration collector portion includes a first low impurity concentration portion which is directly below said base region and between said base region and said high impurity concentration collector portion to connect said base region to said high impurity concentration collection portion and a second low impurity concentration portion surrounding and out of contact with said base region to isolate said base region and said first low impurity concentration portion from regions surrounding said collector region, with the impurity concentration of said first low impurity concentration portion being lower than that of said second low impurity concentration portion.

7. A semiconductor device of claim 6, further comprising a first conductivity type region formed in a MOS transistor forming area on said semiconductor substrate;
    source and drain regions of the second conductivity type separately formed on said first conductivity type region;
    an electrode formed on said first conductivity type region which lies between said source and drain regions;
    device-isolation insulating film; and
    field inversion preventing ion-implemented region.

* * * * *